US010529695B2

(12) United States Patent
Yamamoto et al.

(10) Patent No.: US 10,529,695 B2
(45) Date of Patent: Jan. 7, 2020

(54) LIGHT-EMITTING DEVICE AND BACKLIGHT INCLUDING LIGHT-EMITTING DEVICE

(71) Applicant: NICHIA CORPORATION, Anan-shi, Tokushima (JP)

(72) Inventors: Atsushi Yamamoto, Komatsushima (JP); Keiko Ono, Anan (JP); Saiki Yamamoto, Tokushima (JP); Tomokazu Maruyama, Anan (JP); Takeshi Morikawa, Tokushima (JP); Seitaro Akagawa, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 513 days.

(21) Appl. No.: 15/224,738

(22) Filed: Aug. 1, 2016

(65) Prior Publication Data

US 2017/0040301 A1  Feb. 9, 2017

(30) Foreign Application Priority Data

Aug. 4, 2015 (JP) ................. 2015-154045

(51) Int. Cl.
*F21V 8/00* (2006.01)
*H01L 25/075* (2006.01)
(Continued)

(52) U.S. Cl.
CPC ........ *H01L 25/0753* (2013.01); *H01L 33/508* (2013.01); *H01L 33/62* (2013.01);
(Continued)

(58) Field of Classification Search
CPC ... H01L 25/0753; H01L 33/62; H01L 33/508; H01L 33/486; H01L 33/502;
(Continued)

(56) References Cited

U.S. PATENT DOCUMENTS 8,471,284 B2 * 6/2013 Lai ................. H01L 25/0753
                                                     257/100
8,704,265 B2 * 4/2014 Seo ................. H01L 25/0753
                                                     257/100
(Continued)

FOREIGN PATENT DOCUMENTS

JP  2004-356116 A   12/2004
JP  2006-309209 A   11/2006
(Continued)

*Primary Examiner* — Diane I Lee
*Assistant Examiner* — Omar Rojas Cadima
(74) *Attorney, Agent, or Firm* — Hunton Andrews Kurth LLP (57) ABSTRACT

The light-emitting device includes a first light-emitting element having an emission peak wavelength of 430 nm or more and less than 490 nm, a second light-emitting element having an emission peak wavelength of 490 nm or more and 570 nm or less, a support body at which the first light-emitting element and the second light-emitting element are disposed, and a light-transmissive member containing a red phosphor and covering the first light-emitting element and the second light-emitting element. A content density of the red phosphor in the light-transmissive member in a space between the first and second light-emitting elements is higher in a part below an upper surface of the second light-emitting element than in a part above the upper surface thereof.

18 Claims, 8 Drawing Sheets (51) Int. Cl.
*H01L 33/50* (2010.01)
*H01L 33/62* (2010.01)
*H01L 33/48* (2010.01)

(52) U.S. Cl.
CPC .......... *G02B 6/0073* (2013.01); *H01L 33/486* (2013.01); *H01L 33/502* (2013.01)

(58) Field of Classification Search
CPC . H01L 2224/48091; H01L 2924/00014; H01L 2924/181; H01L 2924/00012; H01L 2224/48257; H01L 2224/48247; H01L 2224/48137; G02B 6/0073
See application file for complete search history.

(56) References Cited

U.S. PATENT DOCUMENTS

| | | | |
|---|---|---|---|
| 2003/0080341 A1* | 5/2003 | Sakano | B29C 67/08 257/79 |
| 2004/0104391 A1* | 6/2004 | Maeda | C09K 11/025 257/79 |
| 2004/0135504 A1* | 7/2004 | Tamaki | C01B 21/0602 313/512 |
| 2007/0108455 A1 | 5/2007 | Sun et al. | |
| 2007/0126011 A1 | 6/2007 | Lee | |
| 2008/0061674 A1* | 3/2008 | Chen | C09K 11/643 313/485 |
| 2008/0258602 A1* | 10/2008 | Masuda | B82Y 30/00 313/487 |
| 2009/0140630 A1 | 6/2009 | Kijima et al. | |
| 2010/0123386 A1* | 5/2010 | Chen | H01L 33/58 313/502 |
| 2011/0215349 A1 | 9/2011 | An et al. | |
| 2012/0267997 A1 | 10/2012 | Kijima et al. | |
| 2013/0087817 A1 | 4/2013 | An et al. | |
| 2014/0232257 A1 | 8/2014 | Watanabe | |
| 2015/0001559 A1 | 1/2015 | Sasaoka et al. | |
| 2015/0001565 A1 | 1/2015 | Iwakura | |
| 2015/0295144 A1 | 10/2015 | Weiler et al. | |
| 2016/0014384 A1 | 1/2016 | Hosoki | |
| 2016/0018078 A1 | 1/2016 | Katoh et al. | |
| 2016/0062023 A1 | 3/2016 | Itoh et al. | |
| 2016/0116140 A1* | 4/2016 | Eguchi | H01L 25/0753 362/293 |
| 2016/0233387 A1 | 8/2016 | Kitano et al. | |
| 2017/0012185 A1 | 1/2017 | Iwakura | |
| 2017/0162758 A1 | 6/2017 | Weiler et al. | |

FOREIGN PATENT DOCUMENTS

| | | |
|---|---|---|
| JP | 2007-142389 A | 6/2007 |
| JP | 2007-158296 A | 6/2007 |
| JP | 2010-034183 A | 2/2010 |
| JP | 2010-118629 A | 5/2010 |
| JP | 2011-249807 A | 12/2011 |
| JP | 2012-069572 A | 4/2012 |
| JP | 2012-227388 A | 11/2012 |
| JP | 2014-127554 A | 7/2014 |
| JP | 2014-165225 A | 9/2014 |
| JP | 2014-215562 A | 11/2014 |
| JP | 2015-012195 A | 1/2015 |
| JP | 2015-021102 A | 2/2015 |
| JP | 2015-029052 A | 2/2015 |
| JP | 2016-025160 A | 2/2016 |
| WO | 2014-068440 A1 | 5/2014 |
| WO | 2014-141879 A1 | 9/2014 |
| WO | 2014-171394 A1 | 10/2014 |
| WO | 2015-056590 A1 | 4/2015 |
| WO | 2015-069385 A1 | 5/2015 |

* cited by examiner

LIGHT-EMITTING DEVICE AND BACKLIGHT INCLUDING LIGHT-EMITTING DEVICE

CROSS-REFERENCE TO RELATED PATENT APPLICATION

This application claims the benefit of Japanese Patent Application 2015-154045, filed on Aug. 4, 2015, the entire disclosure of which is incorporated by reference herein.

BACKGROUND OF THE INVENTION

Field of the Invention

The present disclosure relates to a light-emitting device including a light-emitting element and a phosphor, and a backlight using the light-emitting device.

Description of the Related Art

In general, light-emitting devices including light-emitting elements, such as a light-emitting diode (LED), are widely used as light sources for various luminaires, including a backlight of a liquid crystal display, a LED bulb, a LED fluorescent tube, and a ceiling light.

For example, a light-emitting device disclosed in JP 2007-158296 A and JP 2010-034183 A includes a red phosphor, a light-emitting element that emits blue light, and another light-emitting element that emits green light. Such a light-emitting device achieves high color reproducibility when used as the backlight of a liquid crystal display.

In the light-emitting device disclosed in each of JP 2007-158296 A and JP 2010-034183 A, for example, a plurality of light-emitting elements is placed on the same support body, and among those light-emitting elements, the impact of light absorption might occur, as disclosed in WO 2014/171394. Specifically, the light emitted from one light-emitting element might be absorbed by another light-emitting element. As a result, the luminous efficiency of the light-emitting device is reduced in some cases. For this reason, for the light-emitting device disclosed in WO 2014/171394, a wall is provided between the adjacent light-emitting elements, disposed at the support body, to block the invasion of light from other light-emitting elements, thereby preventing the adverse effect of the light absorption among the light-emitting elements.

However, the light-emitting device disclosed in WO 2014/171394 inevitably must form the wall between the adjacent light-emitting elements and therefore, it sometimes fails to meet the requirement for miniaturization.

SUMMARY OF THE INVENTION

Accordingly, it is an object of the present disclosure to provide a light-emitting device with excellent color reproducibility that can be easily miniaturized.

A light-emitting device according to the present disclosure includes: a first light-emitting element having an emission peak wavelength of 430 nm or more and less than 490 nm; a second light-emitting element having an emission peak wavelength of 490 nm or more and 570 nm or less; and a light-transmissive member containing a red phosphor and covering the first light-emitting element and the second light-emitting element, in which a content density of the red phosphor in the light-transmissive member located in a space between the first and second light-emitting elements is higher in a part below an upper surface of the second light-emitting element than in a part above the upper surface thereof.

Therefore, the present disclosure can provide the light-emitting device with excellent color reproducibility that is easily miniaturized.

DETAILED DESCRIPTION OF THE INVENTION

Embodiments of the present invention will be described in detail below with reference to the accompanying drawings. Although in the description below, terms indicative of specific directions and positions (e.g., "upper", "lower" and other terms including these words) will be used as needed, they are used to make the present invention easier to understand with reference to the drawings and not intended to restrict the scope of the present invention by their meanings. The same reference characters represented through the drawings denote the same or equivalent parts or members.

The following embodiments are illustrative only to exemplify a light-emitting device for embodying the technical idea of the present invention, and the present invention is not limited thereto. The size, material, shape, relative arrangement, etc., of each component mentioned in the embodiments are not intended to limit the scope of the present invention thereto, unless otherwise specified, and are further intended to exemplify the present invention. The size, positional relationship, and the like of members shown in some drawings are emphasized to make the contents easily understood. Note that the relationship between a color name and its chromaticity coordinates, the relationship between the wavelength range of light and the color name of each single light, and the like are in conformity with JIS Z8110.

The light-emitting device according to the present disclosure includes, in addition to a first light-emitting element (blue light-emitting element) having an emission peak wavelength of 430 nm or more and less than 490 nm, a second light-emitting element (green light-emitting element) having an emission peak wavelength of 490 nm or more and 570 nm or less. The light-emitting device further includes a light-transmissive member that contains a red phosphor and covers at least part of the first light-emitting element as well as at least part of the second light-emitting element.

In the light-transmissive member, the content density (distribution density) of a red phosphor in a space between the first light-emitting element and the second light-emitting element is higher in a part below an upper surface of the second light-emitting element than in a part above the upper surface thereof.

Thus, the mutual absorption of light between the first and second light-emitting elements can be reduced without the necessity of providing any wall and the like therebetween.

The majority of light absorbed between the blue and green light-emitting elements is blue light emitted from the blue light-emitting element and partly absorbed by a semiconductor of the green light-emitting element. Compared to this, the absorption of green light emitted from the green light-emitting element and absorbed by a semiconductor of the blue light-emitting element is low.

Thus, the content density of the red phosphor in the light-transmissive member is increased in the part below the upper surface of the green light in the space between the blue and green light-emitting elements, compared to that in the part above the upper surface thereof, whereby most of the blue light directed to the green light-emitting element can be converted into red light by means of the red phosphors, thereby reducing the absorption of blue light by the green light-emitting element.

On the other hand, when the content density of the red phosphor is excessively high across the entire light-transmissive member, the amount of blue light emitted from a light extraction surface of the light-emitting device becomes small, while the amount of red light becomes excessive. For this reason, the content density (distribution density) of the red phosphor in the space between the first and second light-emitting elements is set lower in the part of the light-transmissive member above the upper surface of the green light-emitting element. As a result, in the light-transmissive member, the content density (distribution density) of the red phosphor in the space between the first and second light-emitting elements is set higher in the part below the upper surface of the second light-emitting element than in the part above the upper surface thereof.

The light-emitting device with this arrangement in the present disclosure can emit the green light and blue light having sharp peaks from the respective light emitting elements. Further, the absorption of blue light by the green light-emitting element can be suppressed. Thus, the light-emitting device can achieve the excellent color reproducibility and can be easily miniaturized, compared to a conventional light-emitting device.

The light-emitting devices according to the embodiments of the present invention will be described in detail below.

1. First Embodiment

Figure 1A:
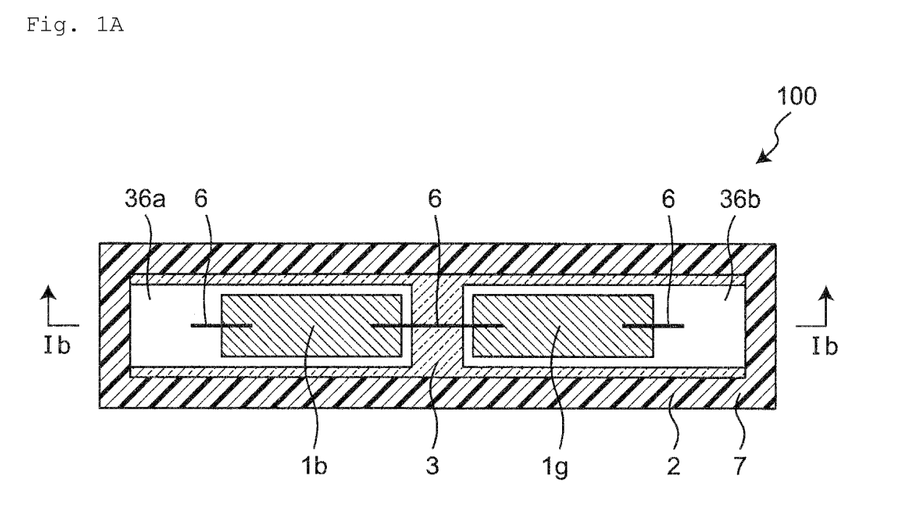
FIG. 1A is a schematic top view of a light-emitting device 100 according to a first embodiment.
Figure 1B:
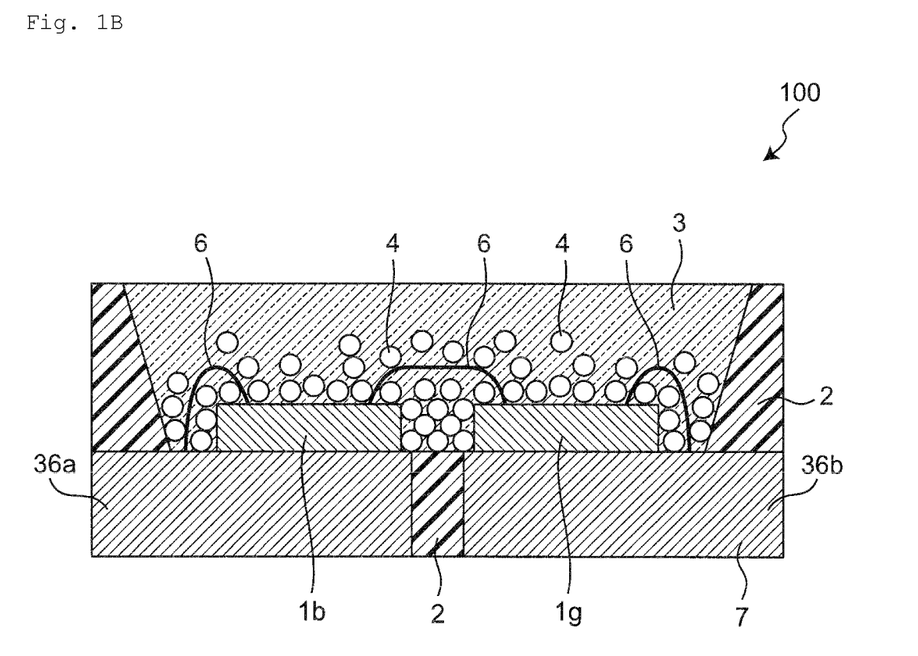
FIG. 1B is a schematic cross-sectional view taken along the line Ib-Ib of FIG. 1A.
Figure 2A:
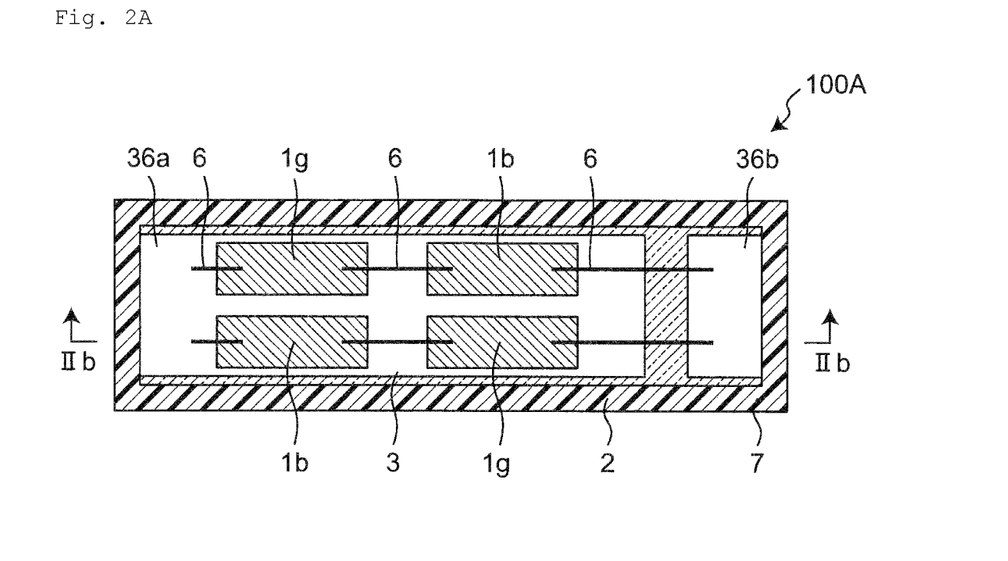
FIG. 2A is a schematic top view showing a light-emitting device 100A as a modified example of the light-emitting device 100.
Figure 2B:
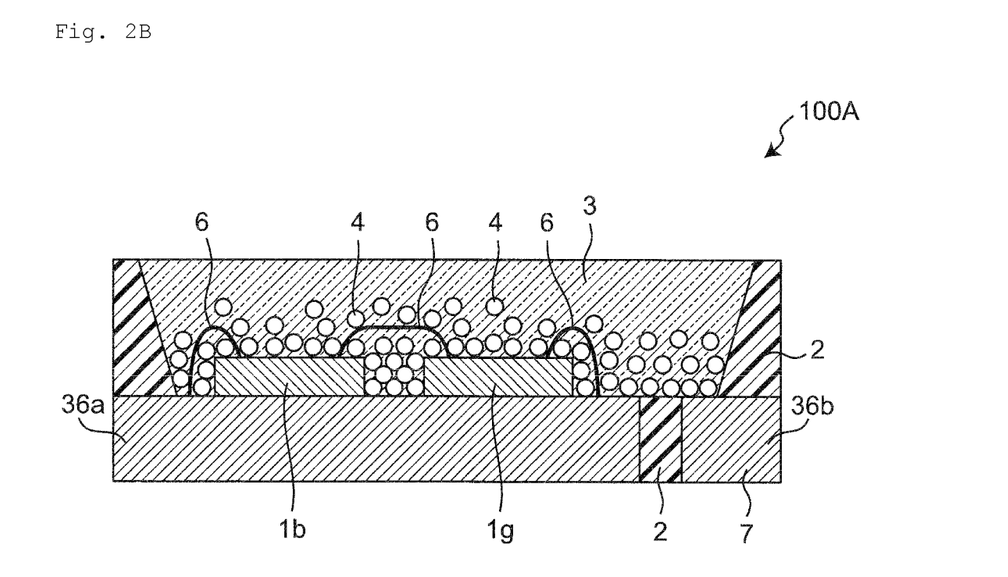
FIG. 2B is a schematic cross-sectional view taken along the line IIb-IIb of FIG. 2A.

FIG. 1A is a schematic top view of a light-emitting device 100 in a first embodiment, and FIG. 1B is a schematic cross-sectional view taken along the line Ib-Ib of FIG. 1A. FIG. 2A is a schematic top view showing a light-emitting device 100A as a modified example of the light-emitting device 100, and FIG. 2B is a schematic cross-sectional view taken along the line IIb-IIb of FIG. 2A. To easily recognize a blue light-emitting element 1b and a green light-emitting element 1g disposed in a light-transmissive member 3, FIGS. 1A and 2A omit the description of a red phosphor 4.

The light-emitting device 100 has at least one blue light-emitting element (first light-emitting element) 1b at an upper surface of a first lead 36a disposed at the bottom of a cavity of a resin package 2. The light-emitting device 100 has at least one green light-emitting element (second light-emitting element) 1g at an upper surface of a second lead 36b disposed at the bottom of the cavity of the resin package 2.

That is, the light-emitting device 100 has at least one of each type of the blue light-emitting element 1b and the green light-emitting element 1g. Depending on the target amount of light and the like, the light-emitting device 100 may include two or more blue light-emitting elements 1b, and/or two or more green light-emitting elements 1g. In the embodiment shown in FIG. 1A, the number of blue light-emitting elements 1b is equal to that of the green light-emitting elements 1g, but the present invention is not limited thereto. Depending on the target light-emission properties, the number of blue light-emitting elements 1b may be greater than that of green light-emitting elements 1g, or the number of green light-emitting elements 1g may be greater than that of blue light-emitting elements 1b.

The light-emitting device 100A has the blue light-emitting elements 1b and the green light-emitting elements 1g at the first lead 36a. In the embodiment shown in FIG. 2A, two blue light-emitting elements 1b and two green light-emitting elements 1g are disposed at the first lead 36a. The blue light-emitting element 1b and the green light-emitting element 1g are arranged side by side sequentially from the left side in a first row from the bottom edge, while the green light-emitting element 1g and the blue light-emitting element 1b are arranged side by side sequentially from the left side in a second row from the bottom edge. Note that in the description below, the light-emitting device 100 will be mainly described in detail. Elements or components of the light-emitting devices 100 and 100A represented by the same reference characters may have substantially the same structures, except when describing specific elements of the light-emitting device 100A.

The blue light-emitting element 1b has its emission peak wavelength of 430 nm or more and less than 490 nm (corresponding to a wavelength range of blue light), and preferably 440 nm or more and 470 nm or less. The green light-emitting element 1g has its emission peak wavelength of 490 nm or more and 570 nm of less (corresponding to a wavelength range of green light), and preferably 520 nm or more and 550 nm or less.

Each of the blue light-emitting element 1b and the green light-emitting element 1g is electrically connected, for example, to an external circuit including a wiring layer on a mounting substrate, and is adapted to emit light with power supplied thereto via the external circuit. In the embodiment of the light-emitting device 100 as shown in FIGS. 1A and 1B, one of the positive and negative electrodes of the blue light-emitting element 1b is connected to the first lead 36a via a wire 6; the other electrode of the blue light-emitting element 1b is connected to one of the positive and negative electrodes of the green light-emitting element 1g via the wire 6; and the other electrode of the green light-emitting element 1g is connected to the second lead 36b via the wire 6. In the example of the light-emitting device 100 as shown in FIGS. 1A and 1B, the other of the positive and negative electrodes of the blue light-emitting element 1b is connected to one of the positive and negative electrodes of the green light-emitting element 1g via the wire 6. However, the present invention is not limited to such connection. Alternatively, the other of the positive and negative electrodes of the blue light-emitting element 1b may be connected to the second lead 36b via the wire 6, and one of the positive and negative electrodes of the green light-emitting element 1g may be connected to the first lead 36a via the wire 6. The first lead 36a is connected, for example, to the wiring layer on the mounting substrate, while the second lead 36b is connected, for example, to another wiring layer on the mounting substrate, whereby the blue light-emitting element 1b and the green light-emitting element 1g can be electrically connected to the external circuit.

In the embodiment of the light-emitting device 100A as shown in FIGS. 2A and 2B, regarding the blue and green light-emitting elements 1b and 1g arranged in the first row from the bottom edge, one of the positive and negative electrodes of the blue light-emitting element 1b is connected to the first lead 36a via a wire 6; the other electrode of the blue light-emitting element 1b is connected to one of the positive and negative electrodes of the green light-emitting element 1g via the wire 6; and the other electrode of the green light-emitting element 1g is connected to the second lead 36b via the wire 6.

On the other hand, in the green light-emitting element 1g and the blue light-emitting element 1b that are arranged in the second row from the bottom edge, one of the positive and negative electrodes of the green light-emitting element 1g is connected to the first lead 36a via a wire 6; the other electrode of the green light-emitting element 1g is connected to one of the positive and negative electrodes of the blue light-emitting element 1b via the wire 6; and the other electrode of the blue light-emitting element 1b is connected to the second lead 36b via the wire 6.

Note that the present invention is not limited to the method which involves directly connecting the electrode of the blue light-emitting element 1b to the electrode of the green light-emitting element 1g via the wire 6. Like the example of the above-mentioned light-emitting device 100, both positive and negative electrodes of the blue light-emitting element 1b and the green light-emitting element 1g may be connected to the first lead 36a or second lead 36b via the wire 6.

Note that in the light-emitting devices 100 and 100A, the resin package 2, the first lead 36a and the second lead 36b are collectively referred to as a support body 7. The support body as mentioned in the present specification is a member for placing the blue light-emitting element 1b and the green light-emitting element 1g. For example, the support body includes a base body, such as a resin package or a substrate, and a conductive member disposed on the surface of or inside the base body and adapted to supply power to the light-emitting element. Examples of the conductive member can include a lead, a via and a wiring layer.

The light-transmissive member 3 is disposed in the cavity of the resin package 2. The light-transmissive member 3 may be made, for example, of sealing resin, glass, or the like. The light-transmissive member 3 contains the red phosphor 4. The red phosphor 4 absorbs part of blue light emitted from the blue light-emitting element 1b to thereby emit red light. That is, the red phosphor 4 converts the wavelength of the blue light to the wavelength of the red light.

The content density of the red phosphor 4 in the space between the blue light-emitting element 1b and the green light-emitting element 1g is set higher in the part below the upper surface of the green light-emitting element 1g than in the part above the upper surface of the green light-emitting element 1g. For example, in the space between the blue light-emitting element 1b and the green light-emitting element 1g, the content density of the red phosphor 4 in the part below the upper surface of the green light-emitting element 1g may be two or more times as high as that of the red phosphor 4 in the part above the upper surface of the green light-emitting element 1g. That is, in the space between the blue and green light-emitting elements 1b and 1g, the content density of the red phosphor 4 in the part from the upper surface of the green light-emitting element 1g to the lower surface of the light-transmissive member 3 may be two or more times as high as that of the red phosphor 4 in the part from the upper surface of the green light-emitting element 1g to the upper surface of the light-transmissive member 3.

The expression "the space between the blue light-emitting element 1b and the green light-emitting element 1g" as used herein contains a part of the light-transmissive member 3 between facing end surfaces of the adjacent blue and green light-emitting elements 1b and 1g, as well as a part of the light-transmissive member 3 directly above the aforesaid part between these end surfaces.

For example, in the embodiments shown in FIGS. 1B and 2B, the above-mentioned expression means a part between the right end surface of the blue light-emitting element 1b and the left end surface of the green light-emitting element 1b opposed to the right end surface, as well as a part located above the aforesaid part between these end surfaces. That is, this expression means the part between the right end surface of the blue light-emitting element 1b and the left end surface of the green light-emitting element 1g as viewed in the lateral direction, and the part above the green light-emitting element 1g as viewed in the vertical direction. However, as shown in FIG. 2A, in the light-emitting device 100A, the "space between the blue light-emitting element 1b and the green light-emitting element 1g" additionally covers a space between the blue and green light-emitting elements 1b and 1g that are positioned on the left side in the figure, a space between the blue and green light-emitting elements 1b and 1g that are positioned on the upper side of the figure, and a space the blue and green light-emitting elements 1b and 1g that are positioned on the right side in the figure. When there are such "spaces between the blue and green light-emitting elements 1b and 1g", in at least one space, preferably all "spaces between the blue and green light-emitting elements 1b and 1g", the content density of the red phosphor 4 is set higher in the part below the upper surface of the green light-emitting element 1g than in the part above the upper surface thereof.

The content density of the red phosphor 4 in the light-transmissive member 3 means the volume of the red phosphor 4 per unit volume of the light-transmissive member 3. For easier evaluation in terms of practical use, the content density of the red phosphor 4 may be determined by observing the cross section. Specifically, the content density of the red phosphor 4 may be evaluated by an area of the red phosphor 4 contained in the unit area of the light-transmissive member 3 in its section.

A method for controlling the content density (distribution density) of the red phosphor 4 mentioned above can be a sedimentation method. In the sedimentation method, for example, the red phosphor is dispersed into the molten light-transmissive-member forming material, such as molten resin or glass. For example, after placing the molten light-transmissive-member forming material into a part, such as the cavity of the resin package 2, where the light-transmissive member 3 is to be formed, the red phosphor 4 is allowed to settle out by gravity, whereby the content density of the red phosphor 4 in the part below the upper surface of the green light-emitting element 1g is set higher than that in the part above the upper surface thereof. In this state, the light-transmissive-member forming material is cured, thereby producing the light-transmissive member 3 having the desired content-density distribution of the red phosphor 4. The red phosphor 4 is preferably forced to settle out using a centrifugal force. For example, before curing the light-transmissive-member forming material, the light-emitting device is centrifugalized by a centrifugal machine, whereby the red phosphor 4 can forcibly settle out.

A preferable embodiment of the content-density distribution of the red phosphor 4 in the light-transmissive member 3 formed by the sedimentation method can be exemplified as shown in FIGS. 1B and 2B. Specifically, in the space between the blue and green light-emitting elements 1b and 1g, the red phosphor 4 barely exists near the upper surface of the light-transmissive member 3, and the distribution density of the red phosphor 4 is gradually increased downward from the part above the upper surface of the green light-emitting element 1g, resulting in the highest distribution density of the red phosphor 4 in the vicinity of the bottom of the cavity of the resin package 2 (near the lower surface of the light-transmissive member 3). To permit the red phosphor 4 to easily settle out in the space between the blue and green light-emitting elements 1b and 1g at such a height that achieves the effects of the present invention, the blue light-emitting element 1b and the green light-emitting element 1g are preferably arranged on the support body at a certain interval, for example, with a spacing therebetween that is larger than the average particle size of the red phosphor. Here, the average particle size of the red phosphor is, in terms of volume-average particle size, for example, 1 µm or more and 100 µm or less, preferably 5 µm or more and 70 µm or more, and more preferably 20 µm or more and 70 µm or more. The volume-average particle size of the red phosphor is a particle size (median size) measured by a laser diffraction particle size analyzer (trade name: MASTER-SIZER 2000, manufactured by Malvern Instruments Ltd.).

The red phosphor 4 may include one or more kinds of CASN based and SCASN based red phosphors.

Preferably, the red phosphor 4 barely absorbs green light in emitting red light. That is, the red phosphor 4 does not substantially convert the green light to the red light. The reflectance of the red phosphor 4 to the green light is preferably 70% or more on average in a wavelength range of the green light. The red phosphor 4 is made of a phosphor that has a high reflectance to the green light, that is, a phosphor that hardly absorbs the green light, or a phosphor that barely converts the wavelength of the green light, which facilitates the design of the light-emitting device.

The use of a red phosphor that absorbs a large amount of green light must consider the wavelength conversion by the red phosphor 4 not only for the light from the blue light-emitting element 1b, but also for the light from the green light-emitting element 1g to balance the output from the light-emitting device. In contrast, like the present disclosure, the use of the red phosphor that barely converts the wavelength of the green light only needs to consider the wavelength conversion of the blue light emitted from the blue light-emitting element 1b, thereby enabling the design of the output balance of the light-emitting device.

Such preferable red phosphors 4 can include the following red phosphors. The red phosphor 4 contains at least one kind of these red phosphors.

A first kind of red phosphor is one with the composition represented by the following general formula (I):

$$A_2MF_6:Mn^{4+} \quad (I)$$

Where, in the above-mentioned general formula (I), A is at least one selected from the group consisting of K, Li, Na, Rb, Cs and $NH_4^+$; and M is at least one element selected from the group consisting of Group 4 elements and Group 14 elements.

The Group 4 elements are titanium (Ti), zirconium (Zr) and hafnium (Hf). The Group 14 elements are silicon (Si), germanium (Ge), tin (Sn) and lead (Pb).

Specific examples of the first kind of red phosphor can include $K_2SiF_6:Mn^{4+}$, $K_2(Si, Ge)F_6:Mn^{4+}$, and $K_2TiF_6:Mn^{4+}$.

The second kind of red phosphor is one with the composition represented by formula of $3.5MgO.0.5MgF_2.GeO_2:Mn^{4+}$, or the composition represented by the following general formula (II):

$$(x-a)MgO.a(Ma)O.b/2(Mb)_2O_3.yMgF_2.c(Mc)X_2.\\(1-d-e)GeO_2.d(Md)O_2.e(Me)_2O_3:Mn^{4+} \quad (II)$$

where, in the above-mentioned general formula (II), Ma is at least one element selected from Ca, Sr, Ba and Zn; Mb is at least one element selected from Sc, La and Lu; Mc is at least one element selected from Ca, Sr, Ba and Zn; X is at least one element selected from F and Cl; Md is at least one element selected from Ti, Sn and Zr; and Me is at least one element selected from B, Al, Ga and In. Furthermore, x, y, a, b, c, d and e are set to satisfy the following ranges: $2 \le x \le 4$; $0 < y \le 2$; $0 \le a \le 1.5$; $0 \le b < 1$; $0 \le c \le 2$; $0 \le d \le 0.5$; and $0 \le e < 1$.

The red phosphor represented by the above general formula (I) in the above-mentioned two red phosphors is more preferable than that represented by the above general formula (II) because of the easiness of excitation with the light from the blue light-emitting element. The red phosphor represented by the above general formula (I) has its emission peak wavelength that is closer to the peak of luminosity curve than that of the red phosphor represented by the above general formula (II), thereby making it possible to increase the luminous fluxes while maintaining red components of the light.

Other specific examples of the second kind of red phosphor can include a red phosphor that has a relatively high reflectance to the green light and is represented by the following formula: $Y_2O_2S:Eu^{3+}$, $La_2O_2S:Eu_{3+}$, $AEu_xLn_{(1-x)}M_2O_8$ ($0 < X \le 1$; A is at least one element selected from Li, Na, K, Pb and Cs; Ln is at least one element selected from Y, La, Cd and Lu; and M is W or Mo).

Such a light-transmissive member 3 covers at least part of the blue light-emitting element 1b and at least part of the green light-emitting element 1g. The light-transmissive member 3 is disposed to have at least its part placed in the space between the blue light-emitting element 1b and the green light-emitting element 1g. Preferably, the light-transmissive member 3 lies over the blue and green light-emitting elements 1b and 1g to be in contact with them. As shown in FIGS. 1A and 1B, the substantially entire surfaces of the blue light-emitting element 1b (that is, upper surface and side surfaces thereof), other than its bottom surface in contact with the first lead 36a or second lead 36b, may be covered with the light-transmissive member 3. Likewise, the substantially entire surfaces of the green light-emitting element 1g (that is, upper surface and side surfaces thereof), other than its bottom surface in contact with the first lead 36a or second lead 36b, may be covered with the light-transmissive member 3.

The light-transmissive member 3 covers the blue light-emitting element 1b, whereby part of the blue light emitted from the blue light-emitting element 1b is absorbed by the red phosphor 4 in the light-transmissive member 3, causing the red phosphor 4 to emit the red light therefrom. Then, the blue light not having its wavelength converted by the red phosphor 4 as well as the red light emitted from the red phosphor 4 pass through the light-transmissive member 3 to be emitted outward from the upper surface of the light-transmissive member 3 (light extraction surface of the light-emitting device 100). On the other hand, the green light emitted from the green light-emitting element 1g is partly wavelength-converted into the red light by the red phosphor 4 (preferably, never converted (or barely converted) into the red light by the red phosphor 4) to sequentially pass through the light-transmissive member 3, and then exits outward from the upper surface of the light-transmissive member 3. In this way, the blue light, the red light, and the green light can be mixed together outside the light-transmissive member 3 to thereby produce a desired color light, for example, white light.

The light-emitting device 100 obtains the green light by the emission from the green light-emitting element 1g. Thus, the green light can easily have the sharp peak, compared to a case in which green light is obtained using a green phosphor. As a result, a liquid crystal display including the light-emitting device 100 can achieve the high color reproducibility.

Further, part of the green light emitted from the green light-emitting element 1g is preferably scattered by the red phosphor 4 without having its wavelength converted. In this case, the intensity distribution of the green light outside the light-transmissive member 3 becomes uniform, thereby enabling the suppression of occurrence of color unevenness. Moreover, for example, the light-transmissive member 3 is used as a sealing resin, and the resin covering the blue light-emitting element 1b and the resin covering the green light-emitting element 1g are designed to be made of the same light-transmissive member 3, which is advantageous in terms of the productivity.

Elements forming the light-emitting device 100 will be described in detail below.

Light-emitting Element

The blue light-emitting element 1b and the green light-emitting element 1g may be arranged in any form. Preferable arrangement of them will be exemplified below.

As shown in FIGS. 1A and 1B, the longitudinal directions of the blue light-emitting element 1b and the green light-emitting element 1g may be set in parallel with the longitudinal direction of the support body 7 (in the lateral direction shown in FIGS. 1A and 1B). Additionally or alternatively, as illustrated in FIGS. 1A and 1B, the longitudinal direction of the blue light-emitting element 1b and the longitudinal direction of the green light-emitting element 1g should be aligned on one straight line. Thus, the light emitted from the light-emitting elements can be more uniformly dispersed across the entire light-emitting device 100.

The longitudinal direction of each of the blue light-emitting element 1b and the green light-emitting element 1g may be set in parallel with the longitudinal direction of a light-emitting element mounting surface of the support body 7. Here, the light-emitting element mounting surface of the support body 7 is a surface of the support body 7 over which at least one of the blue light-emitting element 1b and the green light-emitting element 1g is mounted.

When using a plurality of blue light-emitting elements 1b and a plurality of green light-emitting elements 1g, like the light-emitting device 100A, as shown in FIG. 2A, the blue and green light-emitting elements 1b and 1g may be disposed alternately. That is, the light-emitting element closest to the blue light-emitting element 1b (for example, the light-emitting element with the shortest distance between the center portions of these light-emitting elements) is the green light-emitting element 1g, while the light-emitting element closest to the green light-emitting element 1g is the blue light-emitting element 1b. With this arrangement, the occurrence of color unevenness can be suppressed.

As shown in FIG. 2A, the blue light-emitting element 1b and the green light-emitting element 1g are arranged in one row so as to have their longitudinal directions aligned with one straight line, and a plurality of such rows may be That is, preferably, the longitudinal direction of the blue light-emitting element 1b and the longitudinal direction of the green light-emitting element 1g may be arranged on one straight line, and the longitudinal direction of another blue light-emitting element 1b and the longitudinal direction of another green light-emitting element 1g may be arranged on another straight line.

The preferable arrangements mentioned above may be combined together.

The blue light-emitting element 1b and the green light-emitting element 1g may be semiconductor elements, such as a light-emitting diode (LED) that spontaneously emits the lights by applying a voltage. The semiconductor suitable for use in the blue light-emitting element 1b and the green light-emitting element 1g can be a nitride-based semiconductor ($In_XAl_YGa_{1-X-Y}N$, $0 \le X$, $0 \le Y$, $X+Y \le 1$), or the like. That is, the blue light-emitting element 1b and the green light-emitting element 1g may be nitride semiconductor elements. In this way, the semiconductor materials for the different light-emitting elements are set to the same kind of the nitride-based semiconductor, so that a voltage in the forward direction (forward voltage) Vf of the light-emitting element is made the same between the different light-emitting elements, which preferably eliminates the necessity of individually setting the conditions for driving the light-emitting elements. The number of blue light-emitting elements 1b disposed at the support body 7 may be singular or plural, and the number of green light-emitting elements 1g disposed at the support body 7 may also be singular or plural. The planar shape of each of the blue light-emitting element 1b and the green light-emitting element 1g may be square or rectangular. Alternatively, the blue light-emitting element 1b and the green light-emitting element 1g may be combined together, and a plurality of combinations may be arranged. The number or shape of light-emitting elements can be selected as appropriate, depending on the shape or size of the support body 7.

The light output from the blue light-emitting element 1b may be the same as that from the green light-emitting element 1g. Depending on the target properties, such as color reproducibility, the light output from the blue light-emitting element 1b may differ from that from the green light-emitting element 1g. In one embodiment that can achieve the excellent color reproducibility, the ratio of the light output from the green light-emitting element 1g to that from the blue light-emitting element 1b may be set at 0.3 or more and 0.7 or less.

The ratio of the light output between the light-emitting elements can be determined by measuring respective emission spectra by a spectrophotometer, and then calculating the ratio of the emission peak height of the green light-emitting element to that of the blue light-emitting element.

Although in the embodiment shown in FIGS. 1B and 2B, the upper surface of the blue light-emitting element 1b is positioned at the same height as the upper surface of the green light-emitting element 1g, the present invention is not limited thereto. Alternatively, the upper surface of the green light-emitting element 1g may be positioned above the upper surface of the blue light-emitting element 1b. That is, the upper surface of the green light-emitting element 1g may be disposed closer to the light extraction surface of the light-emitting device 100 (upper surface of the light-transmissive member 3) than the upper surface of the blue light-emitting element 1b is. For example, the green light-emitting element 1g is disposed on a sub-mount member and then placed on the support body such that its upper surface is located at the higher level than the upper surface of the blue light-emitting element 1b. Alternatively or additionally, a stepped portion is formed at the element arrangement surface of the support body for the green light-emitting element 1g or blue light-emitting element 1b. Further, these methods can be combined in use. With such an arrangement, for example, the excellent color reproducibility can be obtained even when the light output from the green light-emitting element 1g is lower than that from the blue light-emitting element 1b to some extent.

Light-transmissive Member

The light-transmissive member 3 may be formed of any material, such as resin or glass. When forming the light-transmissive member 3 using resin, any resin may be used. A preferable example of material for the light-transmissive member is transparent resin. This is because the absorption of lights emitted from the blue and green light-emitting elements 1b and 1g and from the red phosphor 4 can be suppressed. Another preferable example is a semitransparent resin that contains a diffusing agent, such as $TiO_2$ or $SiO_2$, in a transparent resin. This is because the lights emitted from the blue and green light-emitting elements 1b and 1g and from the red phosphor 4 are suppressed from being absorbed to some degree, and these lights can be diffused sufficiently.

Such preferable resins can include, for example, silicone-based resin, and epoxy-based resin. This kind of resin is molten and mixed with the red phosphor 4, causing the red phosphor 4 to be dispersed in the resin. The resin with the red phosphor 4 dispersed therein is charged into the cavity of the resin package 2 and then cured, thereby enabling the formation of the light-transmissive member 3.

Resin Package

The resin package 2 may be formed of any resin. Preferable resins can include, for example, a nylon-based resin, an epoxy-based resin and a silicone-based resin.

For example, a reflective material, such as a metal plating made of silver (Ag) or the like, may be disposed at the surface of the cavity in the resin package 2. Alternatively, the color of the surface of the cavity may be white and the like. Thus, the light reflectance of the surface of the cavity can be improved, permitting a large amount of light reaching the cavity surface to reflect in the emission direction, thus enhancing the efficiency of the light-emitting device 100.

Alternatively, instead of the resin package with the cavity, for example, an insulating substrate is made of ceramic, resin, dielectric material, glass, or a composite material thereof, and connection terminals are disposed on a surface of the insulating substrate, whereby a support body can also be produced. Further, the blue light-emitting element 1b and the green light-emitting element 1g may be disposed at the support body, and the light-transmissive member 3 containing the red phosphor 4 may be formed, for example, by molding to cover the blue light-emitting element 1b and the green light-emitting element 1g.

The light-emitting device 100 may be manufactured by a manufacturing method below.

After disposing the first lead 36a and the second lead 36b in a mold, the resin is charged into the mold, thereby integrally forming the resin package 2, the first lead 36a and the second lead 36b. The blue light-emitting element 1b is arranged on a part of the first lead 36a exposed from the bottom surface of the cavity of the resin package 2. The green light-emitting element 1g is arranged on a part of the second lead 36b exposed from the bottom surface of the cavity of the resin package 2. Thereafter, the wires 6 are used to connect between the lead 36a and the blue light-emitting element 1b, between the blue light-emitting element 1b and the green light-emitting element 1g, and between the green light-emitting element 1g and the second lead 36b, respectively.

Then, the molten resin containing the red phosphor 4 is charged into the cavity of the resin package 2 to be in contact with at least parts of the blue and green light-emitting elements 1b and 1g, allowing the red phosphor 4 to settle out, followed by curing the resin, thereby producing the light-transmissive member 3.

The light-emitting device 100 mentioned above is called "a top view light-emitting device" that has its upper surface as the light extraction surface and its lower surface as the mounting surface. However, the light-emitting device according to the present disclosure is not limited thereto, and encompasses the so-called side view light-emitting device that has its surface adjacent to the light extraction surface as a mounting surface and emits light in the direction parallel to the mounting surface.

2. Second Embodiment

Figure 3:
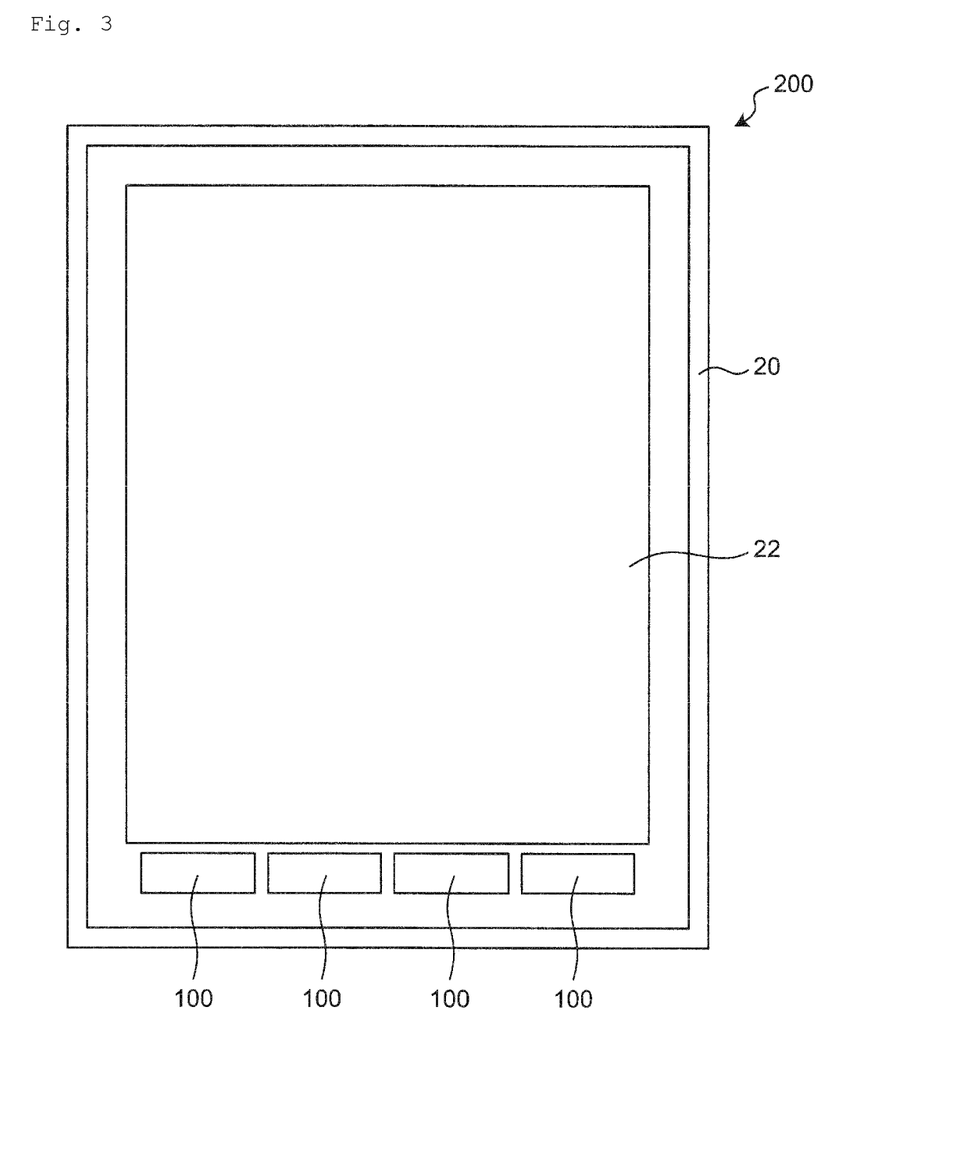
FIG. 3 is a schematic top view showing a backlight 200 according to a second embodiment.

FIG. 3 is a schematic top view showing a backlight 200 according to a second embodiment. The backlight 200 includes the light-emitting device 100 as mentioned below. However, the light-emitting device 100 for use in the description below may be replaced by the light-emitting device 100A.

The backlight 200 includes a case 20, a light guide plate 22 disposed in the case 20, and the light-emitting device 100 disposed in the case 20 and adapted to emit the light toward the light guide plate 22. The backlight 200 irradiates a desired device, such as a liquid crystal panel, with light from the light-emitting device 100 via the light guide plate 22.

The case 20 may be formed to make its inner surface reflective. For example, its inner surface may be colored in white.

At least one of four side surfaces of the light guide plate 22 is used as an incident surface (light input portion). In the embodiment shown in FIG. 3, the side surface positioned on the lower side serves as the incident surface. The light-emitting device 100 is disposed such that its light extraction surface faces the incident surface. Preferably, a plurality of light-emitting devices 100 is disposed along the incident surface. The light emitted from the light-emitting device 100 enters the inside of the light guide plate 22 from the incident surface. When using the plurality of light-emitting devices 100, the lights emitted from the different light-emitting devices 100 are mixed in the light guide plate 22.

The upper surface of the light guide plate 22 serves as an emission surface. A desired device, such as the liquid crystal panel, is disposed at the emission surface, thus allowing the light from the light guide plate 22 to be directed toward such a device.

The light extraction surface of the light-emitting device 100 and the light input portion (incident surface) of the light guide plate 22 may be disposed to keep their longitudinal directions aligned. The longitudinal direction of the light extraction surface of the light-emitting device 100 is set in parallel to the longitudinal direction of the light input surface of the light guide plate, thereby enabling the light from the light-emitting device 100 to be more efficiently guided into the light guide plate 22.

EXAMPLES

1. Example 1

As a light-emitting device in Example 1, the above-mentioned light-emitting device 100 was used. In the light-emitting device 100, one blue light-emitting element 1b and one green light-emitting element 1g were respectively disposed in parallel with the long-side direction of the support body 7 (the long-side direction of a light-emitting element mounting surface of the support body). As the red phosphor 4, $K_2SiF_6:Mn^{4+}$ was used. The red phosphor 4 settled out in the space between the blue light-emitting element 1b and the green light-emitting element 1g by the sedimentation method such that the content density of the red phosphor 4 is higher in the part below the upper surface of the green light-emitting element 1g than in the part above the upper surface of the green light-emitting element 1g. With this arrangement, most of the blue light directed from the blue light-emitting element 1b to the green light-emitting element 1g is converted into the red light by the red phosphor, thereby reducing the light absorption between the blue light emitting elements 1b and the green light emitting elements 1g.

In a light-emitting device used in Comparative Example 1, the green light-emitting element 1g of the light-emitting device 100 was replaced by the blue light-emitting element 1b, whereby the two blue light-emitting elements 1b in total were used. Further, the light-transmissive member 3 used β-sialon as a green phosphor, in addition to the red phosphor 4. Specifically, the resin and red phosphor in the same amounts as in Example 1, to which the green phosphor was added, were prepared as the light-transmissive-member forming material, whereby the light-transmissive member 3 was produced.

Figure 4:
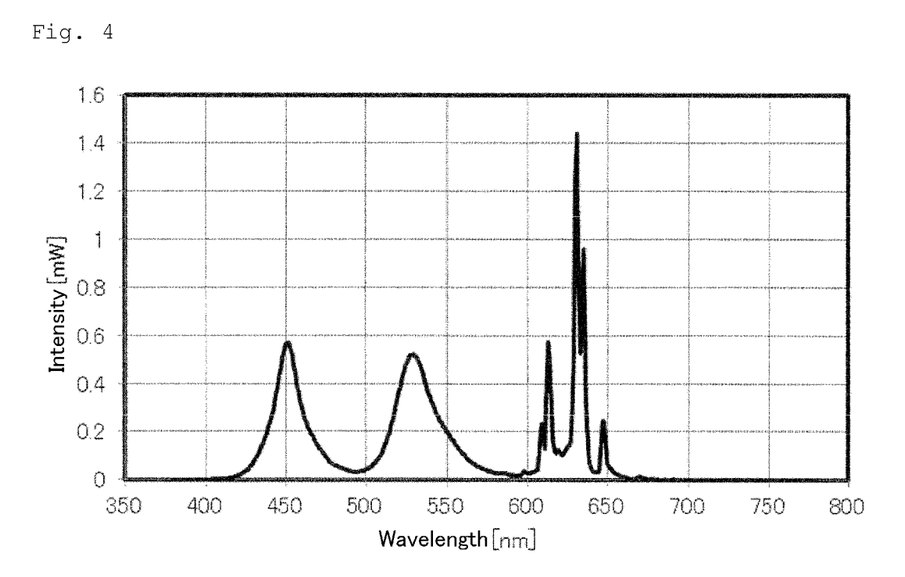
FIG. 4 is an emission spectrum of the light-emitting device 100 in Example 1.
Figure 5:
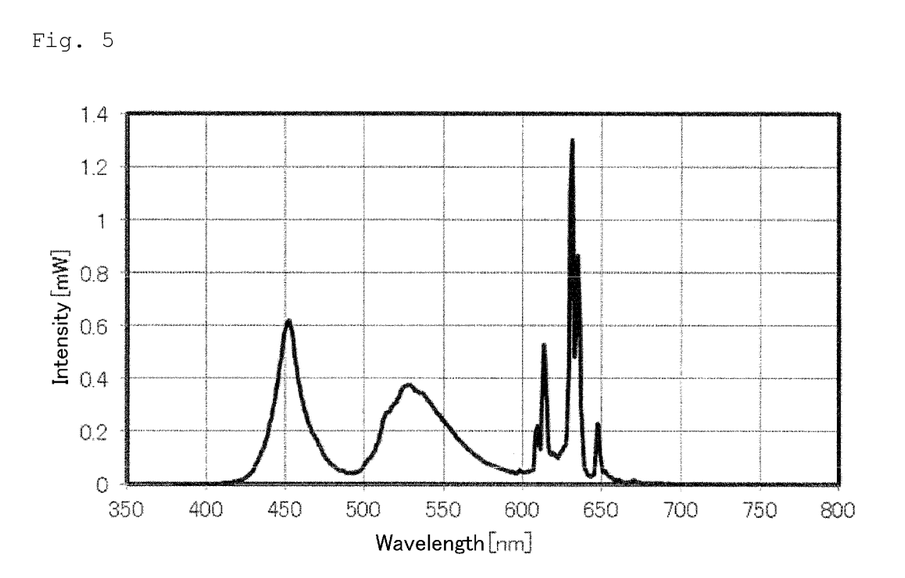
FIG. 5 is an emission spectrum of a light-emitting device in Comparative Example 1.

FIG. 4 shows an emission spectrum from the light-emitting device 100 in Example 1, and FIG. 5 shows an emission spectrum from the light-emitting device in Comparative Example 1. The light-emitting device in Example 1 and the light-emitting device in Comparative Example 1 were used that were designed to obtain as similar white points (chromaticity points of W) as possible after the respective lights passed through color filters mentioned below.

Figure 6:
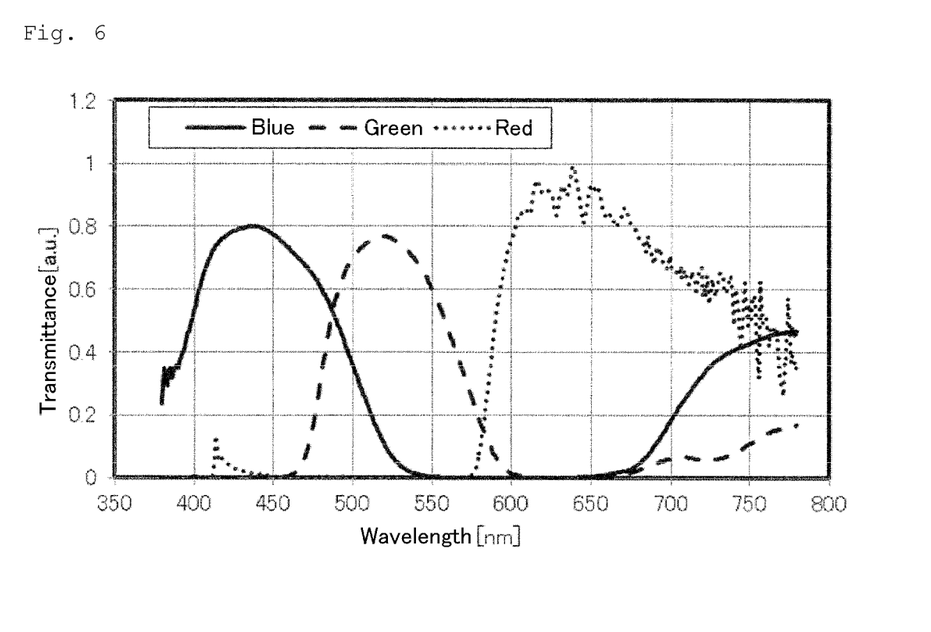
FIG. 6 shows a transmission spectrum of color filters used in Example 1.

The color filters were attached to the light-emitting devices of Example 1 and Comparative Example 1, and the light from each light-emitting device was allowed to pass through the color filter. In more detail, Example 1 and Comparative Example 1 employed a liquid crystal panel using the color filters designed to create a wide color gamut after the transmission of light through the color filters. FIG. 6 shows a transmission spectrum of the employed color filters.

Table 1 shows chromaticity points of the light-emitting devices obtained before and after the light passed through the color filters. It is found that the chromaticity points of the light-emitting device in Example 1 are similar to those of the light-emitting device in Comparative Example 1.

TABLE 1

|  |  | Example 1 | | Comparative Example 1 | |
| --- | --- | --- | --- | --- | --- |
|  |  | x | y | x | y |
| Before transmission through color filters | LED | 0.291 | 0.322 | 0.294 | 0.319 |

TABLE 1-continued

|  |  | Example 1 | | Comparative Example 1 | |
| --- | --- | --- | --- | --- | --- |
|  |  | x | y | x | y |
| After transmission through color filters | B | 0.150 | 0.055 | 0.148 | 0.057 |
|  | G | 0.191 | 0.730 | 0.206 | 0.708 |
|  | R | 0.684 | 0.304 | 0.678 | 0.310 |
|  | W | 0.297 | 0.313 | 0.294 | 0.306 |

Table 2 shows the ratio of the brightness between before and after the light passed through the color filters. Before the light passed through the color filters, the brightness of the light-emitting device in Comparative Example 1 was higher than that in Example 1. In contrast, after the light passed through the color filters, the brightness of the light-emitting device in Example 1 was substantially equal to that in Comparative Example 1. This result shows that the light emitted from the light-emitting device in Comparative Example 1 was absorbed by the color filters more than the light emitted from the light-emitting device in Example 1 when passing through the color filters. That is, it reveals that the light emitted from the light-emitting device in Example 1 passed through the color filter with higher efficiency than that in Comparative Example 1.

TABLE 2

|  |  | Example 1 | Comparative Example 1 |
| --- | --- | --- | --- |
| Before transmission through color filters | Brightness [a.u.] | 1 | 1.041 |
| After transmission through color filters | Brightness [a.u.] | 1 | 1.000 |

Figure 7:
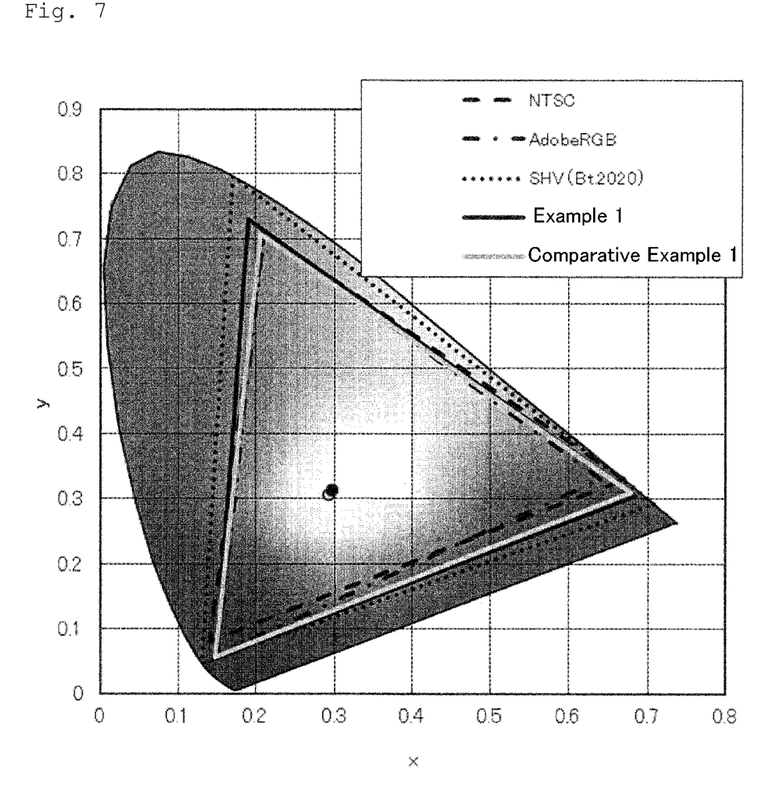
FIG. 7 shows chromaticity coordinates in Example 1 and Comparative Example 1.

Table 3 shows an area ratio and a coverage of each color gamut standard for the light having passed through the color filters. FIG. 7 shows the graph of the results. Because of the use of the liquid crystal panel with the color filters creating the wide color gamut, even the light-emitting device in Comparative Example 1 exhibited almost 100% coverage of Adobe RGB standard, which was substantially the same level as that in the use of the light-emitting device in Example 1.

However, by comparison based on BT2020 standard, which has a wider color gamut than that of Adobe RGB, the light-emitting device used in Example 1 showed 82.6% coverage, while the light-emitting device used in Comparative Example 1 showed 77.9% coverage. Thus, Example 1 improved the coverage by 4.7 percent points, compared to Comparative Example 1. As can be seen from this result, in use of the wide color gamut panel, the light-emitting device used in Example 1 can cover the wider color gamut while keeping the panel brightness, compared to the light-emitting device used in Comparative Example 1. FIG. 7 also shows that in the light-emitting device used in Example 1, a green chromaticity point is moved to the deeper side to thereby enlarge the coverage in the BT2020 standard, compared to the light-emitting device used in Comparative Example 1.

TABLE 3

|  |  | Example 1 | Comparative Example 1 |
|---|---|---|---|
| After transmission through color filters (x, y) | NTSC ratio [%] | 110.6 | 104.4 |
|  | NTSC coverage [%] | 97.6 | 95.8 |
|  | Adobe RGB ratio [%] | 115.8 | 109.3 |
|  | Adobe RGB coverage [%] | 100 | 99.7 |
|  | BT2020 ratio [%] | 82.6 | 77.9 |
|  | BT2020 coverage [%] | 82.6 | 77.9 |

2. Example 2

A light-emitting device having the same structure as that of Example 1 was used in Example 2, while a light-emitting device having the same structure as that of Comparative Example 1 was used in Comparative Example 2. The light-emitting device in Example 2 and the light-emitting device in Comparative Example 2 were used that were designed to obtain as similar white points (W chromaticity points) as possible after the respective lights passed through the color filters mentioned below.

The color filters were attached to the respective light-emitting devices of Example 2 and Comparative Example 2, and the light from each light-emitting device was allowed to pass through the color filters.

Figure 8:
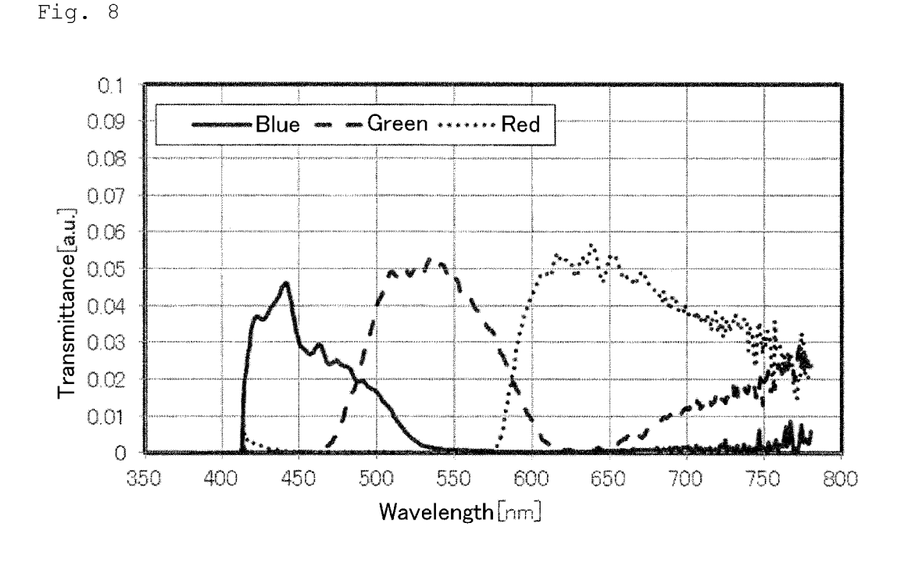
FIG. 8 shows a transmission spectrum of color filters used in Example 2.

In more detail, Example 1 and Comparative Example 1 employed a liquid crystal panel using the color filters, which were designed to allow a color gamut to achieve a high coverage in sRGB standard after the transmission through the color filters when using a light-emitting device including a combination of a blue light-emitting element and a YAG phosphor commonly used for backlights. FIG. 8 shows a transmission spectrum of the employed color filters.

Table 4 shows chromaticity points of the light-emitting device obtained before and after the light passed through the color filters. It is found that the chromaticity points of the light-emitting device in Example 2 are similar to those of the light-emitting device in Comparative Example 2.

TABLE 4

|  |  | Example 2 | | Comparative Example 2 | |
|---|---|---|---|---|---|
|  |  | x | y | x | y |
| Before transmission through color filters | LED | 0.291 | 0.322 | 0.294 | 0.319 |
| After transmission through color filters | B | 0.153 | 0.061 | 0.151 | 0.063 |
|  | G | 0.213 | 0.723 | 0.237 | 0.696 |
|  | R | 0.684 | 0.304 | 0.678 | 0.310 |
|  | W | 0.315 | 0.375 | 0.316 | 0.370 |

Table 5 shows the ratio of the radiant flux and brightness between before and after the light passed through the color filters. Before the light passed through the color filters, the brightness of the light-emitting device in Comparative Example 2 was higher than that in Example 2. Even after the light passed through the color filters, the brightness of the light-emitting device in Comparative Example 2 was higher than that in Example 2, but a difference in brightness therebetween was smaller than that before the light passed through the color filters. This result shows that the light emitted from the light-emitting device in Comparative Example 2 was absorbed by the color filters more than the light emitted from the light-emitting device in Example 2 when passing through the color filter. That is, the light emission from the light-emitting device in Example 2 passed through the color filters with higher efficiency than that in Comparative Example 2.

TABLE 5

|  |  | Example 2 | Comparative Example 2 |
|---|---|---|---|
| Before transmission through color filters | Brightness [a.u.] | 1 | 1.041 |
| After transmission through color filters | Brightness [a.u.] | 1 | 1.019 |

Table 6 shows an area ratio and a coverage of each color gamut standard for the light having passed through the color filters. Because of the use of the liquid crystal panel with the color filters designed to have the high coverage in the sRGB standard, even the light-emitting device in Comparative Example 2 exhibited almost 100% coverage of sRGB standard, which was substantially the same level as that in the use of the light-emitting device in Example 2.

Figure 9:
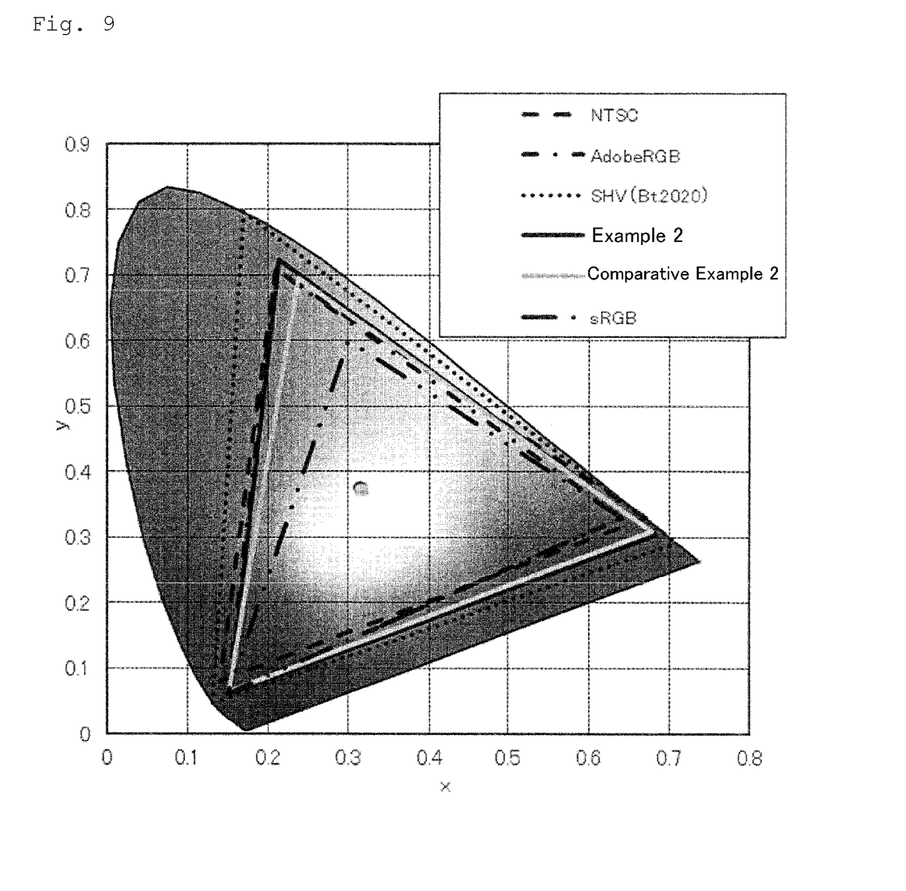
FIG. 9 shows chromaticity coordinates in Example 2 and Comparative Example 2.

However, as shown in FIG. 8, when using color filters with a lower transmittance for each color in which a green color filter exhibited a wider full width at half maximum of the transmission spectrum, as compared to Example 1, the light-emitting device in Comparative Example 2 attained a coverage of 93.7% in terms of Adobe RGB standard which had a wider color gamut than sRGB, while the light-emitting device in Example 2 attained a coverage of 99.0%, which could cover almost the whole color gamut in the Adobe RGB standard. The light-emitting device used in Example 2 improved the coverage by 5.3 percent points, compared to the light-emitting device used in Comparative Example 2. As can be seen from this result, in using the liquid crystal panel with the sRGB standard color filter, the light-emitting device used in Example 2 slightly degrades the panel brightness, compared to the light-emitting device used in Comparative Example 2, but the light-emitting device in Example 2 can drastically improve the coverage of the Adobe RGB standard, compared to Comparative Example 2. As can be seen from FIG. 9, when using the light-emitting device of Example 2, the green chromaticity point is positioned to the deeper side to thereby enlarge the coverage in the Adobe RGB standard, compared to the light-emitting device in Comparative Example 2.

TABLE 6

|  |  | Example 2 | Comparative Example 2 |
|---|---|---|---|
| After transmission through color filters (x, y) | NTSC ratio [%] | 106.4 | 98.6 |
|  | NTSC coverage [%] | 95.8 | 90.6 |
|  | Adobe RGB ratio [%] | 111.4 | 103.2 |
|  | Adobe RGB coverage [%] | 99.0 | 93.7 |
|  | BT2020 ratio [%] | 79.5 | 73.6 |
|  | BT2020 coverage [%] | 79.5 | 73.6 |
|  | sRGB ratio [%] | 150.2 | 139.1 |
|  | sRGB coverage [%] | 100 | 100 |

The light-emitting device according to the present disclosure can be used, for example, as backlights for liquid crystal displays.

What is claimed is:
1. A light-emitting device, comprising:
a first light-emitting element having an emission peak wavelength of 430 nm or more and less than 490 nm;
a second light-emitting element having an emission peak wavelength of 490 nm or more and 570 nm or less;
a support body at which the first light-emitting element and the second light-emitting element are disposed; and a light-transmissive member containing a red phosphor and covering the first light-emitting element and the second light-emitting element, wherein a content density of the red phosphor in the light-transmissive member located in a space between the first light-emitting element and the second light-emitting element is higher in a part below an upper surface of the second light-emitting element than in a part above the upper surface thereof, and the red phosphors located in the light-transmissive member in a space between the first light-emitting element and the second light-emitting element settle out so as to be in contact with each other, wherein the red phosphor includes a phosphor having a composition represented by the following formula (II):

$$(x-a)MgO \cdot a(Ma)O \cdot b/2(Mb)_2O_3 \cdot yMgF_2 \cdot c(Mc)X_2 \cdot (1-d-e)GeO_2 \cdot d(Md)O_2 \cdot e(Me)_2O_3:Mn^{4+} \quad (II)$$

wherein Ma is at least one element selected from Ca, Sr, Ba and Zn; Mb is at least one element selected from Sc, La and Lu; Mc is at least one element selected from Ca, Sr, Ba and Zn; X is at least one element selected from F and Cl; Md is at least one element selected from Ti, Sn and Zr; and Me is at least one element selected from B, Al, Ga and In, furthermore, x, y, a, b, c, d and e are set to satisfy the following ranges: $2 \leq x \leq 4$; $0 < y \leq 2$; $0 \leq a \leq 1.5$; $0 \leq b < 1$; $0 \leq c \leq 2$; $0 \leq d \leq 0.5$; and $0 \leq e < 1$.

2. The light-emitting device according to claim 1, wherein the red phosphor is at least one of a phosphor with the composition represented by the general formula (I) below and a phosphor with the composition represented by $3.5MgO \cdot 0.5MgF_2 \cdot GeO_2:Mn^{4+}$ $$A_2MF_6:Mn^{4+} \quad (I)$$

where, in the general formula (I), A is at least one selected from the group consisting of K, Li, Na, Rb, Cs and $NH^{4+}$; and M is at least one element selected from the group consisting of Group 4 elements and Group 14 elements.

3. The light-emitting device according to claim 1, wherein the first light-emitting element and the second light-emitting element are alternately arranged in a longitudinal direction and a lateral direction at an element mounting surface of the support body.

4. The light-emitting device according to claim 1, wherein a ratio of a light output from the second light-emitting element to that from the first light-emitting element is in a range of 0.3 or more and 0.7 or less.

5. The light-emitting device according to claim 1, wherein an upper surface of the second light-emitting element is positioned closer to a light extraction surface of the light-emitting device, compared to an upper surface of the first light-emitting element.

6. The light-emitting device according to claim 1, wherein the first light-emitting element and the second light-emitting element are nitride semiconductor light-emitting elements.

7. The light-emitting device according to claim 1, wherein one of positive and negative electrodes of the first light-emitting element is connected to one of positive and negative electrodes of the second light-emitting element via a wire.

8. A backlight comprising:
the light-emitting device according to claim 1; and
a light guide plate having a light input portion at a side surface thereof, wherein
the light extraction surface of the light-emitting device and the light input portion are disposed facing each other.

9. The light-emitting device according to claim 1, wherein the red phosphors in the light-transmissive member located in a space between the first light-emitting element and the second light-emitting element continuously contact the support body, the lateral surface of the first light-emitting element, and the lateral surface of the second light-emitting element.

10. The light-emitting device according to claim 1, wherein the distribution density of the red phosphor is gradually increased downward from the part above the upper surface of the second light-emitting element.

11. The light-emitting device according to claim 10, wherein the distribution density of the red phosphor is highest in the vicinity of the support body.

12. The light-emitting device according to claim 1, wherein the volume-average particle size of the red phosphor is in range of 1 μm or more and 100 μm less.

13. The light-emitting device according to claim 1, wherein the reflectance of the red phosphor to the light from the second light-emitting element is 70% or more.

14. The light-emitting device according to claim 1, wherein the red phosphor further includes a phosphor selected from the group consisting of $Y_2O_2S:Eu^{3+}$, $La_2O_2S:Eu^{3+}$, and
$AEuxLn_{(1-x)}M_2O_8$, wherein $0<X \leq 1$; A is at least one element selected from Li, Na, K, Pb and Cs; Ln is at least one element selected from Y, La, Cd and Lu; and M is W or Mo.

15. The light-emitting device according to claim 1, wherein the red phosphor further includes a phosphor selected from the group consisting of $K_2SiF_6:Mn^{4+}$, $K_2(Si,Ge)F_6:Mn^{4+}$ and $K_2TiF_6:Mn^{4+}$.

16. The light-emitting device according to claim 1, wherein in the space between the first light-emitting element and the second light-emitting element, the content density of the red phosphor from the upper surface of the second light-emitting element to a lower surface of the light-transmissive member is two or more times as high as that of the red phosphor in the part from the upper surface of the second light-emitting element to an upper surface of the light-transmissive member.

17. The light-emitting device according to claim 1, wherein the light-transmissive member contains a diffusing agent.

18. The light-emitting device according to claim 17, wherein the diffusing agent is $TiO_2$ or $SiO_2$.

* * * * *